United States Patent
Strom et al.

(10) Patent No.: US 11,303,285 B1
(45) Date of Patent: Apr. 12, 2022

(54) MULTI-MODE DESIGN AND OPERATION FOR TRANSISTOR MISMATCH IMMUNITY

(71) Applicant: INTERNATIONAL BUSINESS MACHINES CORPORATION, Armonk, NY (US)

(72) Inventors: James Strom, Rochester, MN (US); Erik Unterborn, Cary, NC (US); Michael Sperling, Poughkeepsie, NY (US); Dureseti Chidambarrao, Weston, CT (US); Grant P. Kesselring, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/340,239

(22) Filed: Jun. 7, 2021

(51) Int. Cl.
*H03L 7/089* (2006.01)
*H02M 3/07* (2006.01)

(52) U.S. Cl.
CPC .......... *H03L 7/0895* (2013.01); *H02M 3/07* (2013.01)

(58) Field of Classification Search
CPC ....... H03L 7/085; H03L 7/089; H03L 7/0891; H03L 7/0893; H03L 7/0895; H03L 7/0896; H03L 7/0898; H03L 7/093; H02M 3/02; H02M 3/04; H02M 3/06; H02M 3/07
See application file for complete search history.

(56) References Cited

U.S. PATENT DOCUMENTS

| | | | |
|---|---|---|---|
| 6,978,229 B1 | 12/2005 | Saxena et al. | |
| 7,464,346 B2 | 12/2008 | Huang et al. | |
| 7,716,023 B2 | 5/2010 | Barker et al. | |
| 8,022,739 B2 | 9/2011 | Yan | |
| 10,033,270 B2 * | 7/2018 | Bulzacchelli | H02M 3/07 |
| 10,169,507 B2 | 1/2019 | Kuo et al. | |
| 10,339,251 B2 | 7/2019 | Parikh et al. | |
| 10,396,808 B2 * | 8/2019 | Sun | H03L 7/1974 |
| 10,693,473 B2 * | 6/2020 | Tajalli | H03L 7/0807 |

FOREIGN PATENT DOCUMENTS

WO  2003088100 A2  10/2003

* cited by examiner

*Primary Examiner* — Diana J. Cheng
(74) *Attorney, Agent, or Firm* — Robert R. Williams

(57) ABSTRACT

A phase locked loop having a charge pump is described. The charge pump has circuitry to select a mode for each semiconductor chip from a plurality of modes to enhance yield. Nine unique modes are defined from which a selection is made for each chip. The selected mode mitigates effects of device mistracking anomalies for each chip. A method is provided to show how the modes are determined and prioritized.

9 Claims, 12 Drawing Sheets

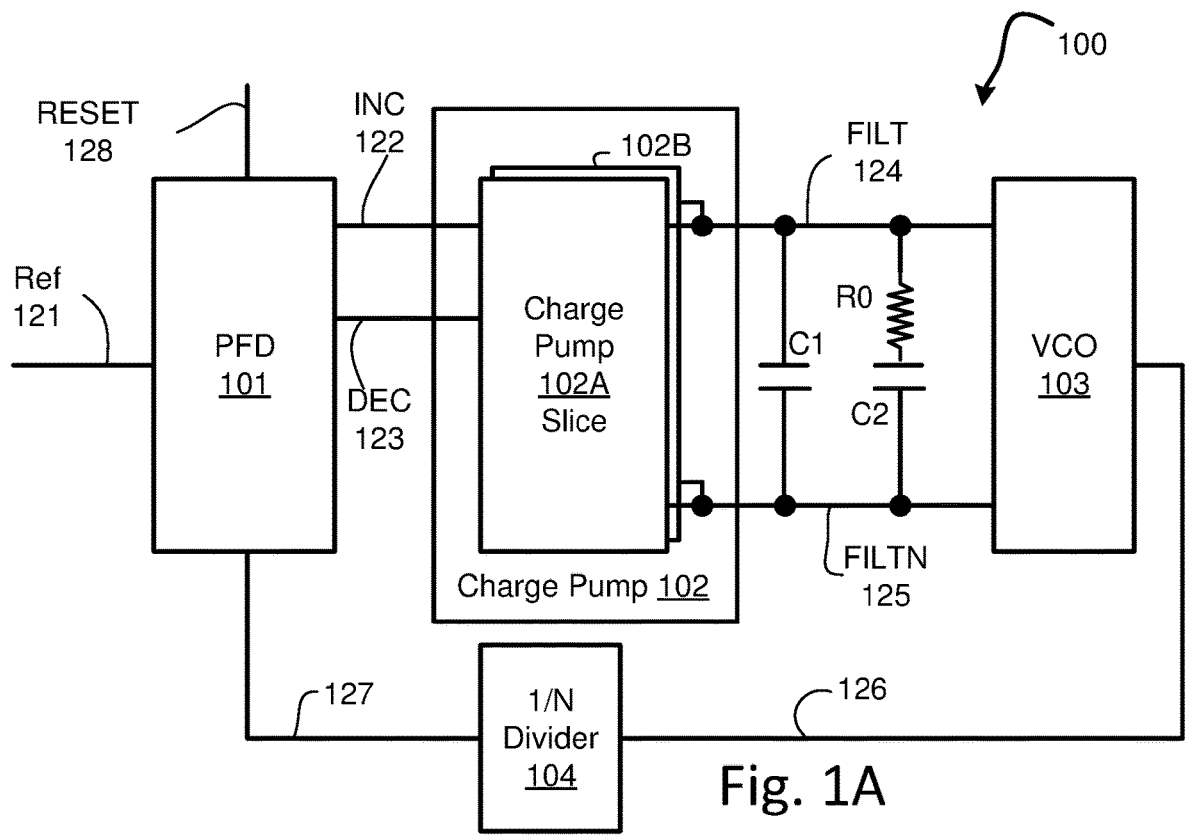
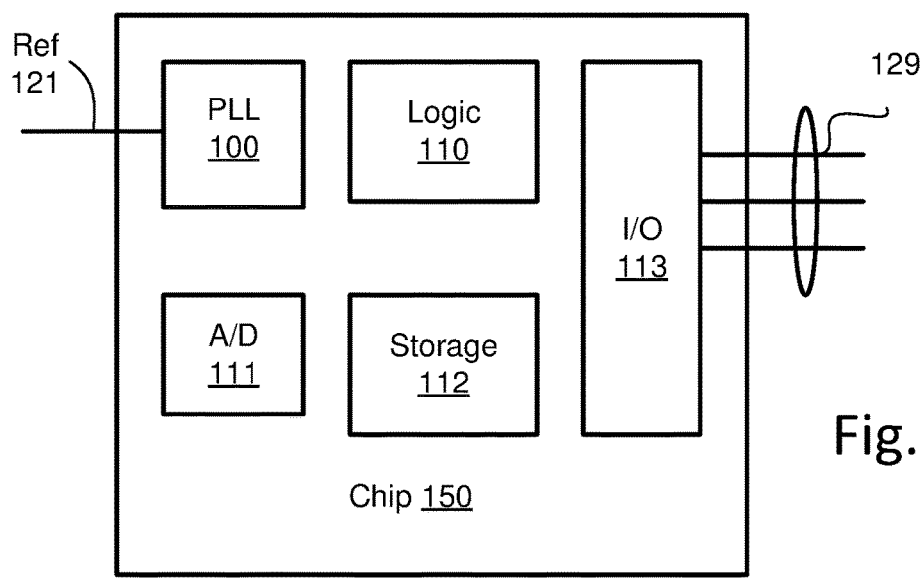
Fig. 1A
Fig. 1B

INC and DEC
buffer daisy chain

| Mode | Description | Signal values |||||||||
|---|---|---|---|---|---|---|---|---|---|---|
| | | A | B | C | D | E | F | G | H | I |
| 1 | Partial NFET feedback. This should work if technology matches models. | 1 | 1 | 0 | 1 | X | 1 | 1 | 1 | 0 |
| 2 | Full NFET feedback. This allows pull down current to turn off completely with low gain. | 1 | 1 | 0 | 1 | X | 1 | 1 | 0 | 0 |
| 3 | Full NFET feedback gain boost (source degeneration). This allows pulldown current to turn off completely with high gain and larger dynamic range so that low offset can be achieved. | 0 | 1 | 1 | 1 | X | 1 | 1 | 0 | 0 |
| 4 | Full PFET feedback. Diode output. This allows pull up current to turn off completely in case the NFET matching is exceptionally bad. This has not been seen in early hardware. | 1 | 1 | 0 | 0 | 1 | 0 | 0 | 1 | 1 |
| 5 | Partial NFET feedback, gain boost (source degeneration). This allows pull down current to partially turn off but with high gain and larger dynamic range. | 0 | 1 | 1 | 0 | X | 1 | 1 | 0 | 1 |
| 6 | Partial PFET feedback. Diode output. This allows pull up current to turn off partially in case the NFET matching is exceptionally bad. The partial feedback helps the loop stability. | 1 | 1 | 0 | 0 | 1 | 0 | 1 | 1 | 1 |
| 7 | Full PFET feedback, gain boost (source degeneration). This allows up current to turn off completely and on with high gain and larger dynamic range so that lower offset can be achieved. It also compensates for very bad NFET matching. | 1 | 0 | 1 | 0 | 1 | 0 | 0 | 1 | 1 |
| 8 | Partial NFET and PFET simultaneous feedback. Provides simultaneous adjustment of pull up and pull down current to compensate for un-modeled PFET and NFET matching. It provides best jitter and good phase margin because of the partial adjustment. | 1 | 1 | 0 | 0 | 1 | 1 | 1 | 0 | 1 |
| 9 | Full NFET and PFET simultaneous feedback. Provides simultaneous adjustment of pull up and pull down current to compensate for un-modeled PFET and NFET matching. | 1 | 1 | 0 | 0 | 1 | 0 | 0 | 0 | 0 |
| 10 | Resistor PFET Feedback instead of diode. Same as other PFET feedback modes (4, 6, 7, 8, 9) but uses resistor to avoid PFET matching dependencies. The resistor feedback also provides different feedback loop bandwidth and phase margin characteristics. | | | | | 0 | | | | |

Fig. 5

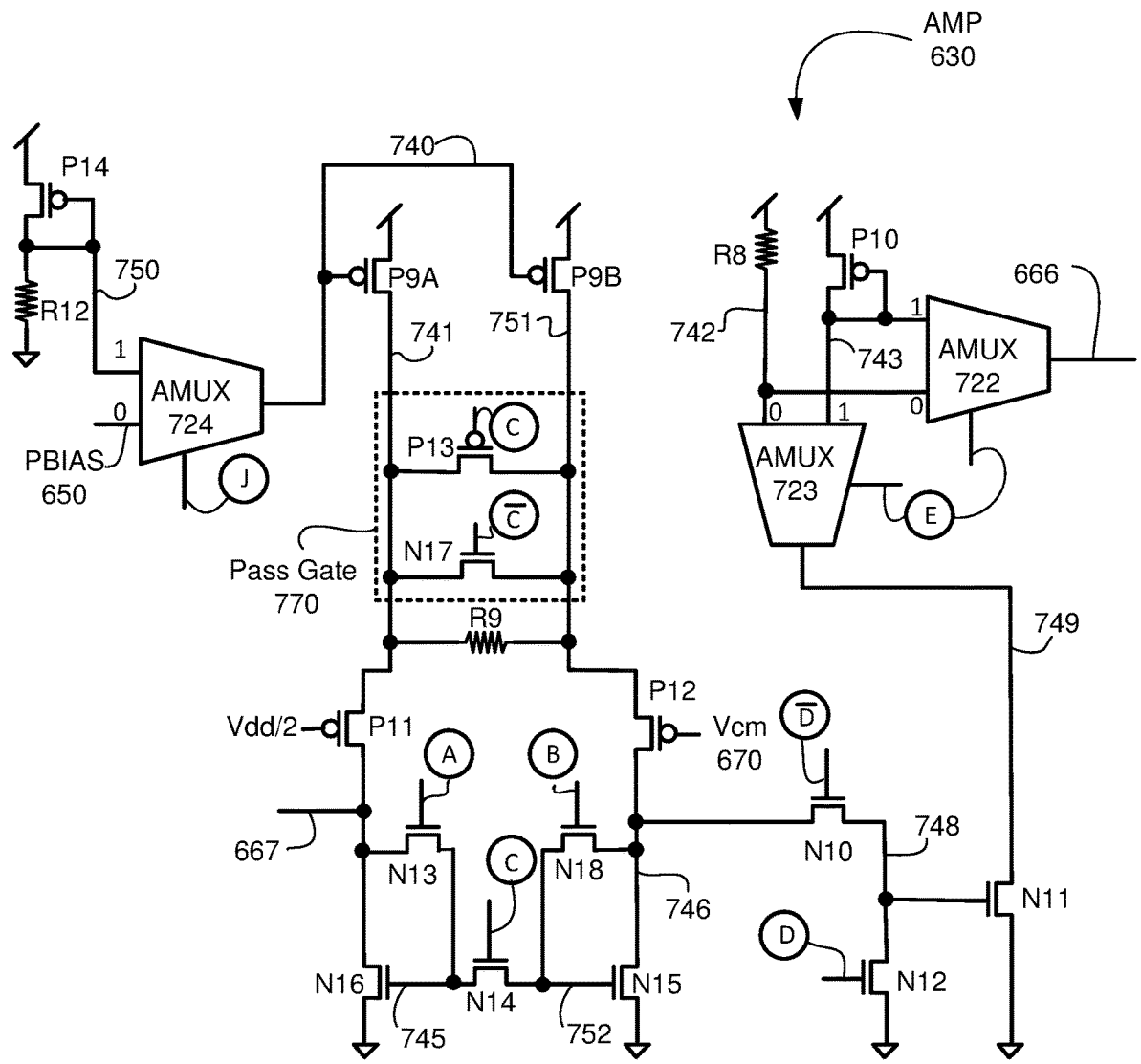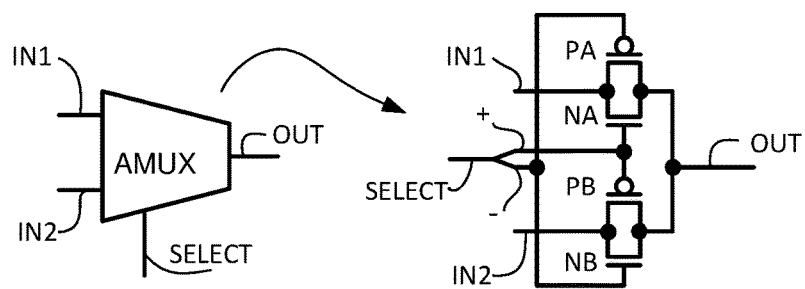
Fig. 7

PLL Multiple Mode Methodology

| Mode | Yield with Vt Adders | | |
|---|---|---|---|
| | No Adders Vt as specified | Weak Up, Strong Down PFET Vt +/- ΔPVt NFET Vt +/- ΔNVt | Weak Down, Strong Up PFET Vt +/- ΔPVt NFET Vt +/- ΔNVt |
| 1 | 100% | 9.90% | 0.1% |
| 2 | 100% | 100% | 1.3% |
| 3 | 100% | 100% | 100.0% |
| 4 | 100% | 99.90% | 95.8% |
| 5 | 100% | 29.20% | 100.0% |
| 6 | 100% | 97.10% | 100.0% |
| 7 | 100% | 100% | 100.0% |
| 8 | 100% | 100% | 99.9% |
| 9 | 100% | 100% | 100.0% |

Fig. 10

Yield – Monte Carlo Simulation

| Mode | Phase Margin | | | | |
| --- | --- | --- | --- | --- | --- |
| | Locked State Pstb | INC, DEC 01 | INC, DEC 10 | Common Mode Step | FMIN to Lock |
| 1 | 88.6 | 79.8 | 55.8 | Stable | Stable |
| 2 | 84.5 | 62 | 39.6 | Stable | Stable |
| 3 | 23.9 | 31.2 | 22.7 | Stable | Stable |
| 4 | 90.1 | 76.9 | 62 | Stable | Stable |
| 5 | 27.5 | 31 | 23.3 | Stable | Stable |
| 6 | 62.8 | 81.7 | 71.4 | Stable | Stable |
| 7 | 19.2 | 35.7 | 24.7 | Not Stable | Not Stable |
| 8 | 87.3 | 77.9 | 47.3 | Stable | Stable |
| 9 | 88.9 | 55.8 | 30.8 | Stable | marginally stable |

Fig. 11

MULTI-MODE DESIGN AND OPERATION FOR TRANSISTOR MISMATCH IMMUNITY

BACKGROUND

Recent semiconductor processes, especially before a new generation of the process has matured, such as a 7 nm (nanometer) process may have device parameters that are outside the specified distributions for those device parameters.

For example, in Field Effect Transistors (FETs) in a 7 nm technology, P-Channel Field Effect Transistors (PFETs) thresholds were found in laboratory measurements to be beyond a specified threshold distribution. N-Channel Field Effect Transistors (NFETs) thresholds were found in laboratory measurements to also be beyond a specified threshold distribution. Worse, different semiconductor chips may have threshold voltage anomalies on different FETs, so that a different "fix" may be necessary on different semiconductor chips of the same design.

Some circuits, such as a phase locked loop (PLL), often used in clock circuits on semiconductor chips, are sensitive to mis-tracking of PFET to PFET, NFET to NFET, and PFET to NFET due to threshold, or other, anomalies in the FETs.

In early hardware, while computer circuit simulation predicted a high yield for a particular PLL design, an unacceptable yield was seen. Laboratory work using nano-probing to determine device parameters, including FET thresholds, showed threshold voltages and tracking even between FETs of the same type were the cause of the unacceptable yield.

Because of the uncertainty of where device anomalies in threshold voltages would occur, it became necessary to develop a design of a PLL that could, on a chip to chip, and even on portions of the PLL, select, from a plurality of modes, a selected mode for each individual semiconductor chip, a mode (or modes, when the PLL has a charge pump comprising multiple charge pump slices). Additional circuitry in the PLL, controlled by the selected mode, adjusts currents in a charge pump in the PLL to overcome device anomalies identified in the laboratory measurements.

Each semiconductor chip may have a number of PLLs. Each PLL may have a plurality of charge pump slices. Testing is done, either at the semiconductor foundry or during bring up, using a mode priority determined to select modes in an order from most likely to provide yield and PLL stability to least likely to provide yield and PLL stability until an operational and stable mode is found, and that mode is used. That method is used for each PLL on a semiconductor chip and, when multiple charge pump slices are implemented, on each charge pump slice. Such testing takes valuable time at a tester, so the prioritization is important.

Methods to analyze the failure mechanisms, laboratory measurement procedures, and circuit simulations to test for yield and stability of PLLs must be developed. Circuitry to implement the modes must be designed.

SUMMARY

Embodiments of the invention provide methods and apparatus to provide per-chip yield enhancement on semiconductor chips in 7 nm (nanometer) and smaller technology.

Early chips using 7 nm technology have had failures due to device characteristics considerably out of specified distributions. In particular, Field Effect Transistor (FET) thresholds have been considerably out of specification distribution. In particular, P-Channel FET (PFET) thresholds have been found to be out of specification and also do not track from one PFET to another. Likewise, N-Channel FET (NFET) thresholds have been out of specification and do not track NFET to NFET. Expected NFET to PFET tracking is also greater than specified. Different chips of the same design may have different failures as a device anomaly on a first chip may not be the same as an anomaly on a second chip. An anomaly is an unexpected device characteristic that is outside of a specified device characteristic distribution. Circuits depending on device characteristic specifications, such as a phase locked loop (PLL), have had unacceptable failure rates.

Because of the uncertainty of device anomalies, it has become necessary to identify apparatus and methods to mitigate, on a chip to chip basis, device anomalies based on laboratory findings on how far out of specification device characteristics such as threshold voltage can be. A charge pump in a PLL circuit is especially sensitive to device anomalies that cause failures in the PLL.

A plurality of modes is defined using device characteristic ranges found in laboratory measurements and demonstrated in both non-transient (DC) circuit simulations for yield and transient circuit simulations to verify stability of the PLL under various conditions the PLL must operate in during startup and noise conditions. Testing at the semiconductor foundry or during bring up of a chip takes time. Therefore, prioritization of testing for what mode to select from a plurality of selectable modes is done, starting from more promising modes and selecting the first mode that is acceptable from a yield and stability standpoint.

An independent claim recites a PLL having a charge pump having a plurality of modes that can be selected from to mitigate unexpectedly large mistracking of FETs using circuitry controlled by a selected mode. As noted above, each chip (and, in fact, each PLL on a given chip) may have different device anomalies, and so must have an on-chip storage of the selected mode. Charge pumps are often implemented with a plurality of "slices" that need to track within specified limits. An on-chip storage of a selected mode for each "slice" may be implemented.

Depending from that independent claim, a dependent claim recites elements of the PLL. Further dependent claim recites controllable current sources that can be controlled to account for "weak" devices, such as PFETs or NFETs with thresholds that are above specified limits. A controller controls, based on the selected mode, how much current must be adjusted to ensure yield.

Dependent claims introduce an amplifier in the charge pump that compares a common mode voltage against a reference voltage to ensure that a differential output of the charge pump is within a specified voltage of the reference voltage and provides voltages to control the controllable current sources. The amplifier uses control signals from the selected mode to provide voltages to control the controllable current sources. Analog multiplexers select between the provided voltages created in the amplifier and current mirror voltages provided "globally" on the chip or elsewhere in the charge pump.

Modern PLL circuits that generate high speed clocks (e.g., 1 GHz (gigahertz) and higher) have phase and frequency detectors (PFDs) that output increment and decrement pulses to the charge pump that are extremely short, on the order of ten picoseconds. To preserve the waveform and duration of such short pulses, it is important that the increment and decrement signals be buffered. In a charge pump having a plurality of "slices", a "daisy chain" of increment and decrement buffers is claimed that puts a single gate load on the increment and decrement signals.

Method claims are included to describe how the corners are defined, how laboratory measurements are done, what computer circuit simulations are defined and performed to ensure yield and stability based on laboratory measurements, and how prioritization is done using the results of the circuit simulations.

BRIEF DESCRIPTION OF THE SEVERAL VIEWS OF THE DRAWINGS

FIG. 1A is a block diagram of a phase locked loop.

FIG. 1B is a block diagram of the phase locked loop on a semiconductor chip.

FIG. 5 is a table of modes defined to mitigate various FET mistracking on a particular chip. A brief description of each mode is given, with control signal values to control analog multiplexers and FET switches which are described in detail in FIG. 6 and FIG. 7.

FIG. 7 shows a detailed schematic of an amplifier shown in FIG. 6.

FIG. 10 shows results of 1000 case Monte Carlo statistical DC (not transient) simulations showing percentage of failures for each of the defined modes for specified process distribution, and the two conditions defined in FIG. 9.

FIG. 11 shows results of transient and period stability (PSTB) circuit simulations for phase margin of the phase locked loop for several operating conditions of the phase locked loop.

DETAILED DESCRIPTION

Figure 2A:
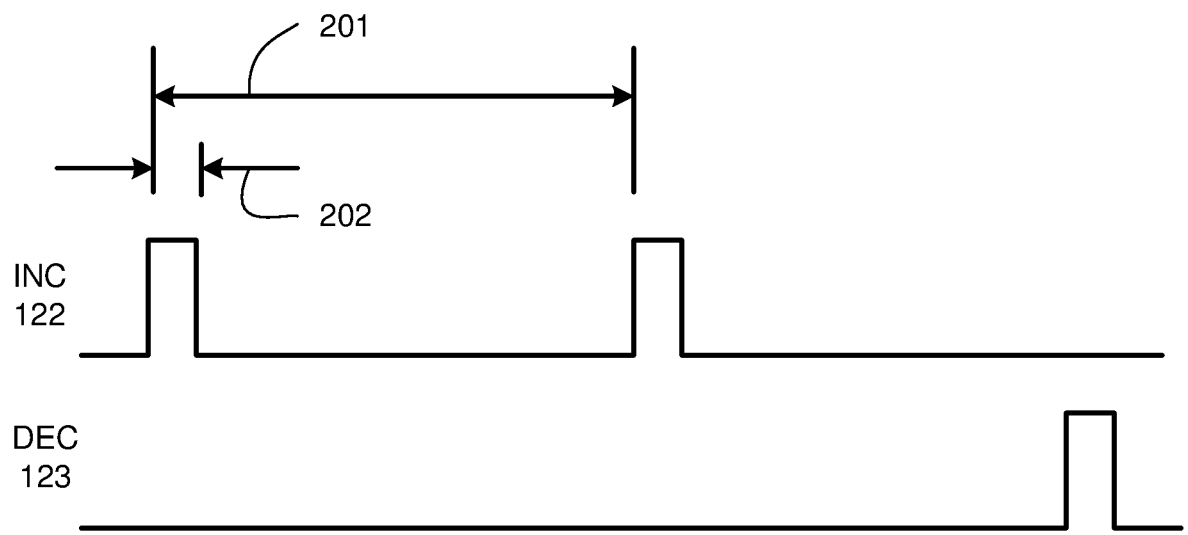
FIG. 2A shows a timing diagram of increment and decrement signals.

Until recently in the semiconductor fabrication technology, Field Effect Transistors (FETs), PFETs being P-Channel Field Effect Transistors and NFETs being N-Channel Field Effect Transistors, could be reliably counted on to track characteristics such as currents versus gate to source and gate to drain voltages. Tracking means that a first PFET would reliably perform very similarly to a second PFET, especially when within a specified distance from each other on a semiconductor chip. Similarly, a first NFET would reliably perform very similarly to a second NFET within a specified distance from each other on the semiconductor chip. Historically, there was also a reliably specified degree of tracking between NFETs and PFETs, again within a specified distance from each other on the semiconductor chip. This tracking was caused by semiconductor processing causing a channel length of a first transistor to be similar to a second transistor. FET thresholds are well known to be related to channel lengths and doping of the channels.

In recent semiconductor processing in which extremely short channel lengths (e.g., 7 nanometers) are fabricated, reliably specifying tracking has become problematic as small variations in channel length, doping, and perhaps other FET characteristics, can cause occasional significant mistracking between PFETs, NFETs, and NFETs to PFETs. As the semiconductor processing becomes more mature, the range of mistracking may be more accurately specified. However, until that maturation, specified mistracking may be inaccurate.

Some circuits, such as a phase locked loop (PLL), can be sensitive to unexpected mistracking. Failures in PLLs have been seen in hardware due to mistracking in a 7 nanometer (nm) technology. Nanoprobing is a method of extracting device electrical parameters on a semiconductor chip using nanoscale tungsten wires. In-depth nanoprobe sweeps of individual devices from early hardware delayered to a metal one (M1) layer was performed. Detailed nanoprobing in a laboratory determined that the failures were caused by mistracking beyond specified tracking distributions. To complicate matters more, each chip was found to have different mistracking characteristics. In measured hardware having a plurality of parallel-connected charge pump slices, current mismatch ratios greater than specified between a first charge pump slice and a second charge pump slice were seen. As an exemplary ratio (not necessarily what was observed in the laboratory) might be 1.26 whereas a specified mismatch ratio may be 1.15. For this reason, circuitry is described herein in embodiments of the invention to mitigate mistracking anomalies on a PLL on each semiconductor chip.

With reference now to FIGS. 1A and 1B, a PLL 100 is shown. PLL 100 comprises a phase frequency detector (PFD) 101, a charge pump 102, a capacitor C1, a RC filter comprising R0 and C2, a voltage controlled oscillator (VCO) 103, and a 1/N divider 104. Charge pump 102 may comprise a plurality of charge pump 102 slices, designated 102A and 102B in FIG. 1A. Charge pump 102 slices have their output plus phases "dotted" (connected together) and their output minus phases "dotted". Overall, charge pump 102 refers to the combined charge pump function. Charge pump 102 may have only one charge pump 102 slice and simply be referred to as charge pump 102.

PFD 101 receives a reference signal 121 having a specified frequency and receives feedback signal 127 which is output by 1/N divider 104. PFD 101 outputs INC 122 and DEC 123 which are received by charge pump 102. An active level on INC 122 indicates to charge pump 102 that an increase in frequency of VCO 103 is needed. An active level on DEC 123 indicates to charge pump 102 that a decrease in frequency of VCO 103 is needed. Charge pump 102 outputs FILT 124 and FILTN 125 to VCO 103.

To reset PLL 100, RESET 128 is asserted to drive a continuous "1" on one of INC 122 and DEC 123. In an embodiment where, when RESET 128 is asserted and DEC 123 is "1", VCO 103 will operate at a minimum VCO 103 frequency. In an embodiment where, when RESET 128 is asserted and INC 122 is "1", VCO 103 frequency is at a maximum VCO frequency. After RESET 128 is released, PLL 100 will change frequency such that feedback signal 127 and Ref 121 are locked.

In embodiments of the invention, there may be a plurality of charge pump 102 instances, called charge pump 102 slices, coupled in parallel. Each charge pump 102 slice receives INC 122 and DEC 123 (possibly buffered in a previous charge pump 102 slice) and have outputs coupled to FILT 124 and FILTN 125. Such an embodiment is shown in FIG. 1A, first charge pump 102 slice referenced as 102A, and a second charge pump slice 102B, is shown. Additional charge pump 102 slices are contemplated. It is important that PFETs between charge pump 102 slices track. It is important that NFETs between charge pump slices 102 track. In the detailed nanoprobe analysis above, it was noted that, in failing PLLs 100, current in a first PFET in one charge pump 102 slice could be as much as 0.437 of a second PFET in an identical charge pump 102 slice at some distance away. Failing PLLs 100 averaged a ratio of 0.524 between the first and second PFETs. Correctly operating charge pumps averaged a ratio of 0.7 or better between charge pump 102 slices.

R0 and C2 serves as a loop filter as is well known in PLL designs. C1 is also coupled between FILT 124 and FILTN 125 to filter out high frequency noise. Capacitance of C1 is generally around 10% of capacitance of C2. PLL loop filters are well known in the art and will not be further discussed herein.

VCO 103 receives a differential signal on FILT 124 and FILTN 125 and produces a signal 126 having a frequency that is determined by voltage between FILT 124 and FILTN 125. Signal 126 may be used for clocking on a semiconductor chip. Signal 126 may be implemented as a differential signal or a single-ended signal. In FIG. 1A, frequency output by VCO 103 should be "N" times the frequency of reference signal 121. 1/N divider 104 divides the frequency of signal 126 by "N" and outputs the result on feedback signal 127 to PFD 101 which, as above, then produces an active INC 122 or an active DEC 123, when adjustments to the frequency of signal 126 needs adjustment.

FIG. 1B shows an exemplary chip 150. Chip 150 includes PLL 100. Chip 150 receives reference 121 which is used by PFD 101 as described above. Chip 150 also typically has a number of inputs and outputs generally shown as I/O signals 129 driven and/or received by I/O 113. Chip 150 typically has logic circuitry 110, storage 112, and may include analog to digital circuit A/D 111. Storage 112 may include dynamic random access memory (DRAM), static random access memory (SRAM), electrical fuses (efuses), registers, or other storage circuits.

FIG. 2A shows exemplary waveforms of INC 122 and DEC 123. For a non-limiting timing example, PFD 101 may activate either (or neither) of INC 122 or DEC 123 every 10 nanoseconds (ns), as shown by interval 201. Width of an INC 122 or DEC 123 active pulse may be 10 picoseconds (ps) as shown by interval 202. INC 122 and DEC 123 pulse widths, being short, typically will need buffering to reduce loading. Also, in the exemplary charge pumps 102 that will be explained in detail, both phases of INC 122 and DEC 123 are needed.

Figure 2B:
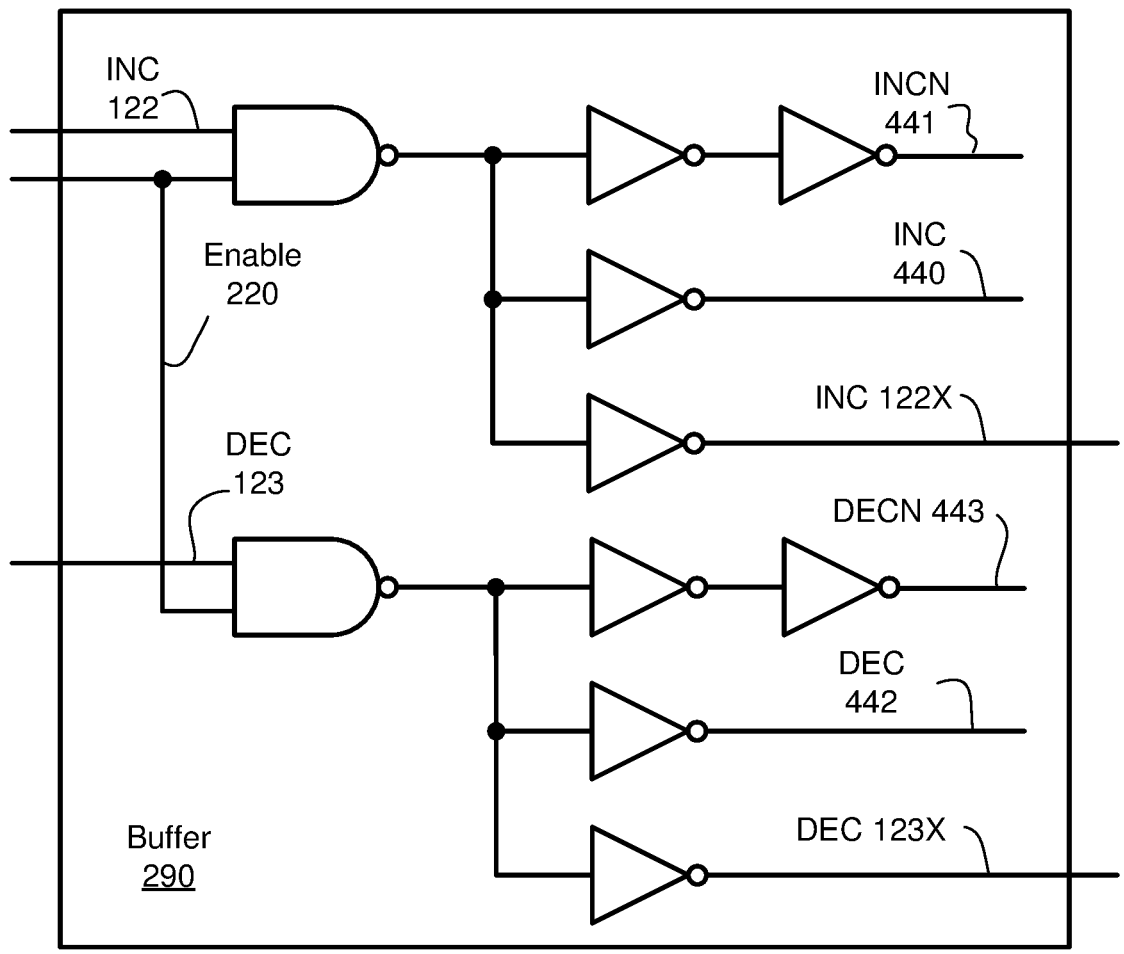
FIG. 2B shows circuits to buffer and invert increment and decrement signals.

FIG. 2B shows an exemplary buffering circuit buffer 290 that produces buffered positive and negative phases of INC 122 and DEC 123 for charge pump 102. INC 440 is a positive buffered version of INC 122. INCN 441 is a negative buffered version of INC 122. DEC 442 is a positive buffered version of DEC 123. DECN 443 is a negative buffered version of DEC 123. Embodiments of the invention may comprise multiple charge pump 102 slices referenced as 102A and 102B as shown coupled in parallel in FIG. 1A. Enable 220 is used to turn off repowering of INC 122 and DEC 123.

Figure 2C:
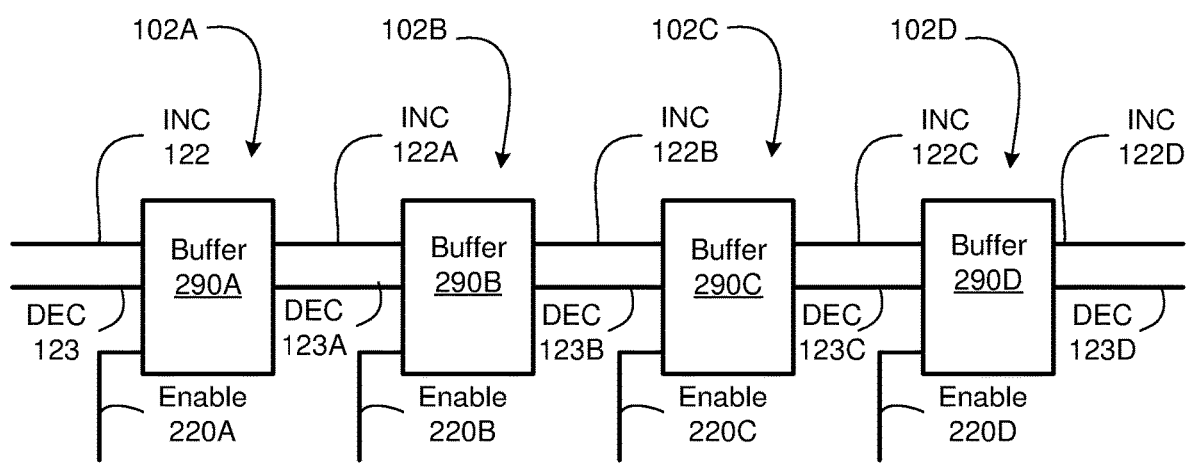
FIG. 2C shows a "daisy chain" of buffers for the increment and decrement signals.

FIG. 2C shows a "daisy chain" of four buffers 290, one in each of four charge pump 102 slices, the charge pump 102 slices referenced as 102A, 102B, 102C, and 102D. The corresponding buffers 290 are referenced as 290A, 290B, 290C, and 290D. Besides the buffering in each of the charge pumps 102 described earlier, INC 122 and DEC 123 are buffered and passed on as INC 122X and DEC 123X in each buffer 290 as shown in FIG. 2B and received in the next buffer 290 as INC 122 and DEC 123 inputs for that next buffer 290 so that increment and decrements are buffered and "daisy chained". Buffer 290A receives INC 122 and DEC 123 from PFD 101. When enable 220A is "1", buffer 290A repowers and passes INC 122 and DEC 123 as INC 122A and DEC 123A to buffer 290B. Similarly, buffer 290C receives INC 122B and DEC 123B from buffer 290B. Buffer 290D receives INC 122C and DEC 123C from buffer 290C. Buffer 290D produces INC 122D and DEC 123D, but, in this exemplary chain of four buffers from corresponding charge pump 102 slices, INC 122D and DEC 123D are not connected to anything, unless, for test purposes, to verify integrity of the buffer daisy chain, INC 122D and DEC 123D are latched to allow verification that the buffer chain passes INC 122 and DEC 123 all the way through.

In the daisy chain of buffers 290 described above, each buffer 290 may have a separate enable 220, shown as enables 220A, 220B, 220C, and 220D in FIG. 2C. If enable 220A is "0", INC 122 and DEC 123 will not be passed on (and charge pump 102A slice is not operational). If enable 220A is "1", INC 122 and DEC 123 will be passed on to buffer 290B, and charge pump 102A slice is operational. If enable 220B is "0", INC 122 and DEC 123 are not passed on, and charge pump slice 102B is not operational. Enable 220C and enable 220D work in a similar manner. In other words, a "0" on any buffer 290 enable 220 blocks the INC 122 and DEC 123 daisy chain path and renders the corresponding charge pump 102 slice inoperable, and also INC 122 and DEC 123 are not passed on to buffers further down the daisy chain. This daisy chain enabling provides, in the example, none, one, two, three, or all four charge pump 102 slices to operate.

It is understood that INC 122 and DEC 123 inputs to a buffer 290 could be connected to inputs of the inverters shown in FIG. 2B that output INC 122X and DEC 123X to allow any buffer 290 to be individually turned on or off but doing so would add another gate load to INC 122 and DEC 123, and it is critical to minimize gate loading on signals having small pulse widths which as explained with reference to FIG. 2A may be on the order of 10 picoseconds.

It is understood that in various embodiments of a PLL 100, some or all the circuitry may be implemented with current mode logic (CML) with appropriate buffering.

Figure 3:
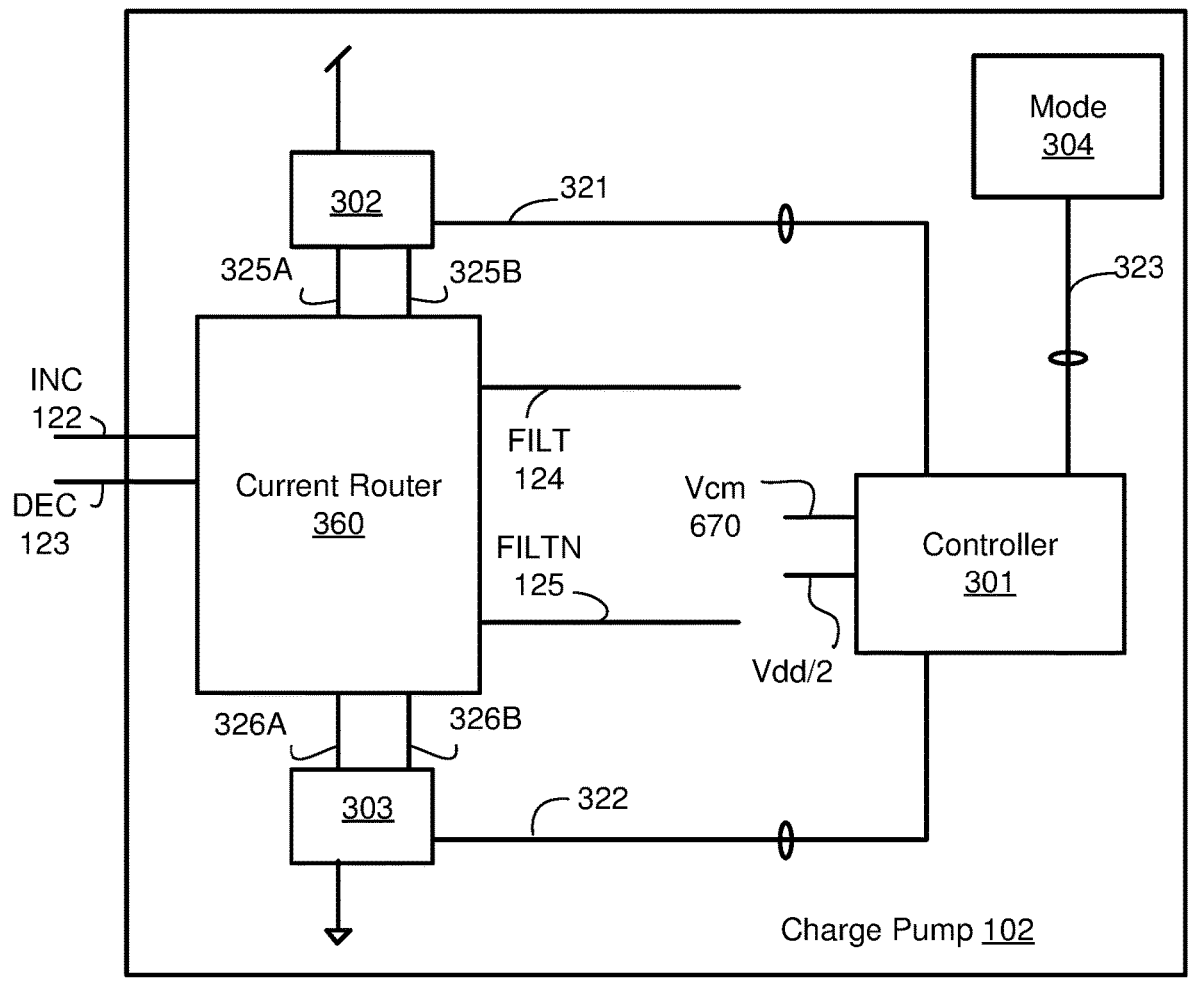
FIG. 3 is a high level schematic that shows a charge pump with controllable currents and a current router to increase or decrease a voltage between a plus and minus phase of a differential signal. The charge pump is capable of mitigating observed mistracking of Field Effect Transistors (FETs) according to various embodiments of the invention and operating in a particular mode, from a plurality of modes, peculiar to an individual semiconductor chip.

FIG. 3 shows a high level diagram of charge pump 102 according to embodiments of the invention.

Charge pump 102, as explained above, receives INC 122 and DEC 123 or buffered and inverted versions of INC 122 and DEC 123, and outputs FILT 124 and FILTN 125. Current on signals 325A and 325B is provided from a supply voltage Vdd by a controllable current source 302, controlled by signals 321, to provide current to current router 360. Likewise, a controllable current source 303, controlled by signals 322, takes current from current router 360 on signals 326A and 326B to ground. In general, signals 321 and 322 each are buses, and comprise a plurality of signals, as indicated by the ellipses around signals 321 and 322.

Mode 304 is a storage to hold which mode of a plurality of modes to use on a particular chip. Mode 304 communicates with controller 301 via signals 323, which is a bus that contains a plurality of signals, as indicated by the ellipse. In embodiments where charge pump 102 comprises a plurality of charge pump 102 slices, mode 304 may store a selected mode to use for each charge pump 102 slice.

An optimal mode from the plurality of modes may be determined at a tester in a factory where the chip is produced. The mode may be determined based on PLL 100 stability and correct operation. For example, the tester may receive one or more signals in the chip's signals 129 described above that can be used to determine correct operation and stability of PLL 100. A common mode voltage 670 (described later) may be compared to Vdd/2 (a reference voltage, typically half of supply voltage Vdd). Modes can be checked, one by one, for correct operation of PLL 100. Stability of PLL 100 in each mode can be checked by running well-known logic built in self-test (LBIST) or by running input output built in self-test (IOBIST) at the tester and checking for logic errors (e.g., parity, error correcting codes (ECC), bit error rate (BER), or other checking techniques that can check for correct operation of chip 150). Upon selection of the mode chosen for a particular chip 150, the selected mode may be written into mode 304. Mode 304 may be an efuse portion of storage 112. The selected mode read from mode 304 is used by controller 301.

In an alternative embodiment, a proper mode may be selected during bring up of chip 150 at the customer's site. A set of possible modes can be loaded into chip 150 through one or more of signals 129 and stored in registers in storage 112. Loading may be scanned into a portion of storage 112, such as DRAM, SRAM, registers, or latches. The set of possible modes from which to select may be stored in an efuse area of mode 304. The selected mode, set at the factory or during bring up from the set of possible modes, will be applied to controllable current sources 302 and 303, shown generically in FIG. 3 by controller 301.

Figure 6:
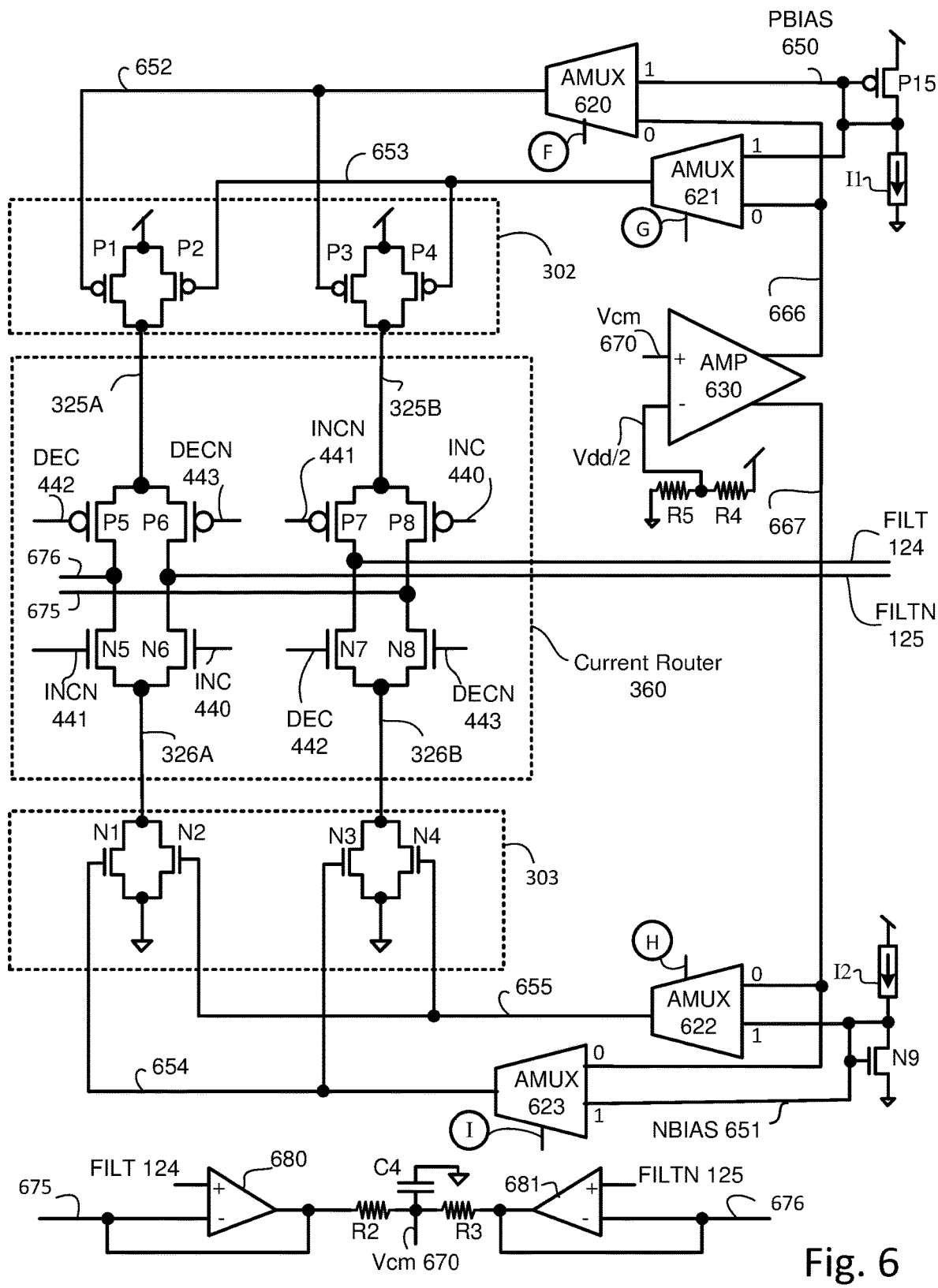
FIG. 6 shows additional detail for the charge pump of FIG. 4.

With continuing reference to FIG. 3, controller 301 may compare common mode Vcm 670 against reference voltage Vdd/2. It is understood that Vdd/2 (half the supply voltage) is used as a reference voltage for exemplary purposes. Other reference voltages may be used, but Vdd/2 is readily created with a resistor divider from Vdd (the supply voltage) and ground. Vdd/2 is also a good reference voltage choice because the charge pump is symmetrical between Vdd and ground, with PFETs pulling up and NFETs pulling down. Controller 301 applies control signals on signal buses 321 and 322 according to the selected mode. Vcm 670 generation is shown in FIG. 6 and described with reference to FIG. 6.

Vcm 670 comparison to Vdd/2 may be used by a tester at the factory to determine a mode to write into an efuse storage in storage 112 on chip 150. The tester would receive Vcm 670 and Vdd/2 over signals in signals 129. Alternatively, A/D 111 could provide a digital value of a difference between Vcm 670 and Vdd/2 and send that result to the tester over one or more signals in signals 129. Vcm 670 comparison to Vdd/2 may also be used if mode selection is done during bring up of chip 150.

Figure 4:
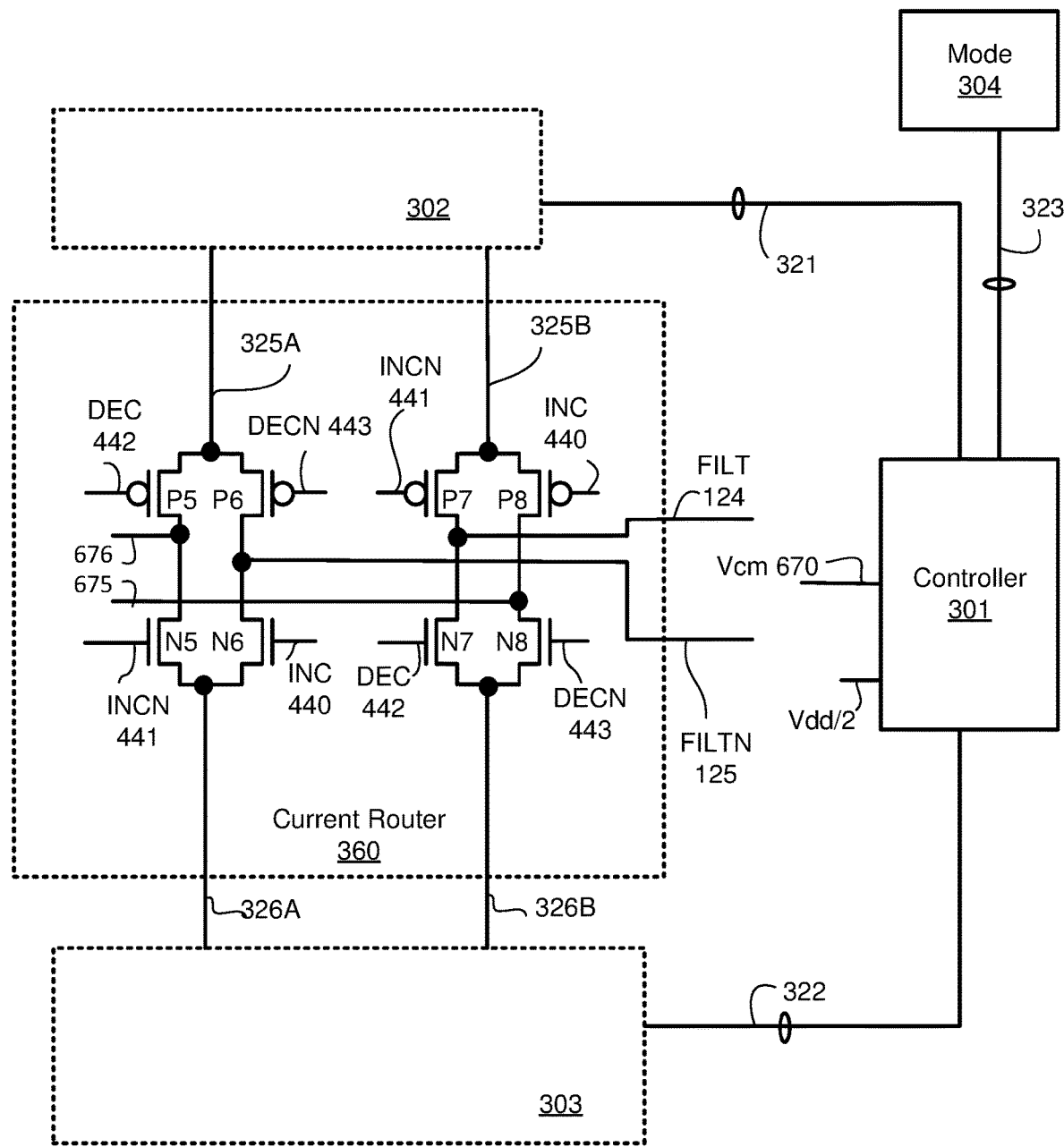
FIG. 4 is similar to FIG. 3 but with a detailed schematic of the current router.

With reference now to FIG. 4, an embodiment of the invention is shown. Mode 304 communicates the selected mode to controller 301 via signals 323. In the embodiment of FIG. 4, signals on 321 and 322 each have a plurality of signal conductors. Signals in 321 and 322 have values for each mode as shown in FIG. 5.

Current router 360 comprises a first current routing tree having P5, P6, N5, and N6, and a second current routing tree having P7, P8, N7, and N8. Routing is determined by values of DEC 442, DECN 443, INCN 441, and INC 440 in the first and second current routing trees.

Conductors 325A and 325B carry equal currents in controllable current source 302 to first and second current routing trees, respectively, in current router 360.

Conductors 326A and 326B carry equal currents in controllable current source 303 from first and second current routing trees, respectively, in current router 360.

Current router 360 receives INC 440 which, as described earlier with reference to FIG. 2A, briefly rises if more voltage needs to be between FILT 124 and FILTN 125. That is, the difference between FILT 124 and FILTN 125 must be increased to increase frequency output by VCO 103 on signal 126. Charge is added to FILT 124 by P7 to make FILT voltage higher and charge is subtracted from FILTN 125 by N6 to make FILTN lower to increase voltage between FILT 124 and FILTN 125.

Current router 360 receives DEC 442 which briefly rises if voltage between FILT 124 and FILTN 125 needs to be reduced. Charge is removed from FILT 124 by N7 to lower voltage on FILT 124, and charge is added to FILTN 125 by P6 to make FILTN 125 voltage higher; this reduces voltage between FILT 124 and FILTN 125.

When INC 440 rises and INCN falls, P8 shuts off and P7 turns on to add charge to FILT 124. At the same time, INC 440 turns on N6 which removes charge from FILTN and INCN turns off N5. Adding charge to FILT 124 and subtracting charge from FILTN 125 increases voltage from FILT 124 to FILTN 125 and will cause VCO 103 to increase frequency of its output to signal 126. DEC 442 is "0" causing P5 to conduct. As N5 turns off, P5 current goes out on signal 676 and is absorbed by operational amplifier 681 shown in FIG. 6. Likewise, as P8 is turned off, current that had been flowing from P8 through N8 is sourced through signal 675 from operational amplifier 680 in FIG. 6.

When DEC 442 rises and DECN 443 falls, P6 turns on and P5 turns off. Current through P6 flows to FILTN 125 to raise FILTN 125 voltage. N7 turns on, drawing current from FILT 124 to lower FILT 124. Voltage between FILT and FILTN decreases, and frequency of VCO 103 output on signal 126 will decrease. As P5 is turned off, current that had flowed to N5 from P5 is now sourced on signal 676 from operational amplifier 681. As N8 is turned off, current flowing through P8 is absorbed through signal 675 by operational amplifier 680.

Except for when the narrow pulses of INC 122 or DEC 123 are active, current on 325A flows through P5 and N5, producing a signal on 676 that is coupled to circuitry that creates Vcm 670 as shown in FIG. 6. Likewise, except for when the narrow pulses of INC 122 or DEC 123 are active, current on signal 325B flows through P8 and N8, producing a signal on 675 that is coupled to the circuitry that creates Vcm 670 shown in FIG. 6.

With reference now to FIG. 6 and FIG. 7, a detailed description of circuitry and operation of an embodiment of the invention is given.

In FIG. 6, current router 360 operates as described for current router 360 in FIG. 4. FETs and signals are referenced the same.

In the following discussion, circled letters in the drawings, e.g., an Ⓕ and so on, represent digital signals from controller 301 based on a mode stored in mode 304. FIG. 5 shows a table of modes, for which values ("1" or "0") for "A", "B", "C", "D", "E", "F", "G", "H", and "I" for each mode of the embodiment of the invention shown in FIGS. 6 and 7. "A", "B", "C", and "D" are applied to gates on FETs in FIG. 7. "E" controls input signal selection by analog multiplexers (AMUXes) 722 and 723 in FIG. 7. "F", "G", "H", and "I" control input selection in AMUXes 620, 621, 622, and 623, respectively, in FIG. 6.

The inputs of AMUX circuits are shown as "1" and "0" to show which input is selected by a select input being "1" or "0".

A generalized schematic of an analog multiplexer (AMUX) appears in FIG. 7. The generalized AMUX is shown to have two inputs IN1 and IN2, a SELECT input, PA, NA, PB, and NB, and an output OUT. The SELECT input may have a positive and inverted signal, as shown, or the analog multiplexer may further comprise an inverter to produce the inverted signal. AMUXes of this type may be used for AMUXes 620, 621, 622, 623, 722, 723, and 724 in FIGS. 6 and 7.

With reference now to FIG. 6, P15 and current source I1 provide a voltage on PBIAS 650, a voltage that is transferred through analog multiplexer (AMUX) 620 to signal 652 when "F" is "1". Signal 666 has a voltage generated in AMP 630 that is transferred through AMUX 620 to signal 652 when "F" is "0". P1 and P3 will provide mirror currents to signals 325A and 325B according to voltage on signal 652. Current source I1 may be a current provided on the chip such as an NFET-resistor configuration to current mirror the NFET current as current source I1. Current source I1 may also be a current provided from outside of chip 150 over a signal in signals 129. A nonlimiting but exemplary value for current source I1 may be 25 microamps. Alternatively, current source I1 may be a resistor coupled between a drain of P15 and ground to act as a current source.

In embodiments comprising a plurality of parallel connected of charge pump 102 slices, a single PBIAS 650 may be shared by all slices of charge pump 102. However, each charge pump 102 slice may have its own circuitry to produce a local PBIAS 650.

AMUX 621 will pass PBIAS 650 to signal 653 when "G" is "1" and will pass the voltage generated in AMP 630 on 666 to signal 653 when "G" is "0". P2 and P4 will provide mirror currents according to voltage on signal 653.

N9 and current source I2 provide a voltage on NBIAS 651. As with current source I1, current source I2 may be formed on chip 150 or be provided from off chip on a signal in signals 129. A nonlimiting current value for current source I2 may be 25 microamps. Alternatively, as with current source I1, current source I2 may be a resistor between a drain of N9 and Vdd, or a mirrored PFET current mirror configuration. It is understood that other PFET and NFET current mirror references shown as a resistor and a PFET (or NFET) such as P14 and R12 shown in FIG. 7 may also be implemented as a PFET (or NFET) and a current source, similar to current source I1 and current source I2.

When "H" is "1", AMUX 622 will pass voltage on NBIAS 651 to signal 655. When "H" is "0", AMUX 622 will pass a voltage generated in AMP 630 on signal 667 to signal 655. N2 and N4 will provide equal currents to signals 326A and 326B accordingly.

When "I" is "0", AMUX 623 will pass the voltage on signal 667 to signal 654. When "I" is "1", AMUX 623 will pass the voltage on NBIAS 651. N1 and N3 will provide equal currents to signals 326A and 326B accordingly.

Amplifier "AMP" 630 receives Vcm 670 and Vdd/2 (Vdd/2 is shown as produced by the R4 and R5 voltage divider between Vdd and ground). AMP 630 outputs voltages on signals 666 and 667. AMP 630 will be described in detail with reference to FIG. 7.

FIG. 6 also shows circuitry to generate Vcm 670. Operational amplifier 680 receives FILT 124 and signal 675 with signal 675 also connected to an output of operational amplifier 680. Operational amplifier 680 will source or sink current on signal 675 to force voltage on signal 675 towards FILT 124 voltage. Operational amplifier 681 receives FILTN 125 and signal 676 with signal 676 also connected to an output of operational amplifier 681. Operational amplifier 681 will source or sink current to force signal 676 towards FILTN 125 voltage. A voltage divider comprising R2 and R3 is coupled between signals 675 and 676 and this voltage divider creates a common mode voltage Vcm 670 of signals 675 and 676. Vcm 670 may have a capacitor C4 to filter out any high frequency noise.

With reference now to FIG. 7, a detailed schematic of AMP 630 is shown.

AMP 630 comprises a differential amplifier comprising P9A; P9B; pass gate 770 having P13 and N17; resistor R9; P11; P12; N16; and N15.

AMUX 724 can optionally be implemented. AMUX 724, under control of select signal "J" selects signal 750 when "J" is "1" or PBIAS 650 when "J" is "0". Signal 750 is a current mirror voltage from P14 and R12 which is local to AMP 630. PBIAS 650 is created as shown in FIG. 6. If PFETs track reasonably well, PBIAS 650 may better track PFETs P1, P2, P3, and P4 shown in FIG. 6. If PFETs are found to not track well, "J" can be used to select signal 750 to pass to signal 740, signal 750 as a current mirror voltage from the P14 and R12 current mirror voltage which may be physically closer to the circuitry in AMP 630 and therefore expected to track more closely with PFETs in AMP 630.

P9A and P9B provide a "tail current" for the differential amplifier based on voltage on signal 740.

See control signal chart in FIG. 5 for what control signal values are used for each mode and description of each mode. For convenience, mode and signal values are included here from TABLEs 1 through 9 for each mode. A paragraph is included to describe mode 10 which selects an I*R voltage drop (R8 and current from N11) from Vdd instead of a current mirror voltage from P10 for current from N11. As explained earlier, "A", "B", "C", and "D" each are applied to one or more FET gates in FIG. 7. "E" is used as selection control for AMUX 722 and AMUX 723 in FIG. 7. "F", "G", "H", and "I" are used as selection controls for AMUX 620, AMUX 621, AMUX 622, and AMUX 623, respectively, in FIG. 6.

TABLE

Mode 1

| | | | | Signal values | | | | |
|---|---|---|---|---|---|---|---|---|
| Mode | A | B | C | D | E | F | G | H | I |
| 1 | 1 | 1 | 0 | 1 | X | 1 | 1 | 1 | 0 |

In mode 1, N13 is on ("A" is "1"). N18 is on ("B is "1"). N14 is off ("C" is "0"). N12 is on ("D" is "1"). N10 is off ("D" is "1"). N11 is off ("D" inverse is "0") and N12 pulls signal 748 to "0". Pass gate 770 is on ("C" is "0" and "C" inverse is "1"). N16 current mirrors current from P11 and puts a current mirror voltage on signal 667. N15 carries current from P12. "E" is a "don't care" as signal 666 is not selected by AMUX 620 or AMUX 621 because "F" is "1" AMUX 620 selects PBIAS 650; and because G" is "1", AMUX 621 selects PBIAS 650. AMUX 622 selects NBIAS 651 because "H" is "1" and AMUX 623 selects signal 667 because "I" is "0". Pass gate 770 is on ("C" is "0" so P13 and N17 are on) so there is no source degeneration.

TABLE

Mode 2

| Mode | A | B | C | D | E | F | G | H | I |
|---|---|---|---|---|---|---|---|---|---|
| 2 | 1 | 1 | 0 | 1 | X | 1 | 1 | 0 | 0 |

Signal values

In mode 2, N13 is on ("A" is "1"). N18 is on ("B" is "1"). N14 is off ("C" is "0"). N12 is on ("D" is "1"). N10 is off ("D" inverse is "0"). N11 is off ("D" is "1" and N12 pulls signal 748 to ground). Pass gate 770 is on ("C" is "0" and "C" inverse is "1") making signals 741 and 751 the same voltage so no source degeneration occurs. N16 current mirrors current through P11 and puts a current mirror voltage on signal 667. N15 carries current from P12. N11 is off (N12 pulls signal 748 to "0"). "E" is a "don't care" because signal 666 is not selected by AMUX 620 ("F" is "1") or AMUX 621 ("G" is "1"). AMUX 622 selects signal 667 ("H" is "0"). AMUX 623 selects signal 667 ("I" is "0"). Pass gate 770 is on ("C" is "0" so P13 and N17 are on) so there is no source degeneration.

TABLE

Mode 3

Signal values

| Mode | A | B | C | D | E | F | G | H | I |
|---|---|---|---|---|---|---|---|---|---|
| 3 | 0 | 1 | 1 | 1 | X | 1 | 1 | 0 | 0 |

In mode 3, N13 is off ("A" is "0"). N14 is on ("C" is "1"). N18 is on ("B" is "1"). N12 is on ("D" is "1"). N10 is off ("D" inverse is "0"). N12 is "on" ("D" is "1"). N11 is off (N12 pulls signal 748 to "0"). "E" is a "don't care" as AMUX 620 ("F is "1") and AMUX 621 ("G" is "1") select PBIAS 650. AMUX 622 ("H" is "0") and AMUX 623 ("I" is "0") select signal 667. N15 current mirrors current through P12 and produces a current mirror voltage to N16 via N18 and N14. N14 couples signal 745 (the gate of N16) to signal 752 (the gate of N15). Pass gate 770 is off ("C" is "1" and "C" inverse is "0") so R9 provides source degeneration (P11 and P12 sources) in the differential amplifier.

TABLE

Mode 4

Signal values

| Mode | A | B | C | D | E | F | G | H | I |
|---|---|---|---|---|---|---|---|---|---|
| 4 | 1 | 1 | 0 | 0 | 1 | 0 | 0 | 1 | 1 |

In mode 4, N13 is on ("A" is "1"). N18 is on ("B" is "1"). N14 is off ("C" is "0"). N12 is off ("D" is "0"). N10 is on ("D" inverse is "1"). N15 current mirrors P12 current to N11 via signal 746 and N10 to signal 748. N16 current mirrors P11 current on a current mirror voltage to signal 667. P10 carries N11 current through AMUX 723 ("E" is "1") and passes a current mirror voltage through AMUX 722 ("E" is "1") to signal 666. AMUX 620 ("F" is "0") and AMUX 621 ("G" is "0") pass the current mirror voltage on signal 666. AMUX 622 ("H" is "1") and AMUX 623 ("I" is "1") pass NBIAS 651. Pass gate 770 is on ("C" is "0" so P13 and N17 are on) so there is no source degeneration.

TABLE

Mode 5

Signal values

| Mode | A | B | C | D | E | F | G | H | I |
|---|---|---|---|---|---|---|---|---|---|
| 5 | 0 | 1 | 1 | 1 | x | 1 | 1 | 0 | 1 |

In mode 5, N13 is off ("A" is "0"). N14 is on ("C" is "1"). N18 is on ("B" is "1"). N12 is on ("D" is "1"). N10 is off ("D" inverse is "0"). N11 is off (N12 pulls signal 748 to "0"). Pass gate 770 is off to provide source degeneration ("C" is "0" and "C" inverse is "1"). P12 current flows through N15. Signal 746 has a current mirror voltage for current through N15; this voltage is also passed to N16 through N18 and N14. N16 then carries the same current as N15. Signal 667 carries a voltage dependent on P11 current and N16 current. PBIAS 650 is passed by AMUX 620 ("F" is "1") and AMUX 621 ("G" is "1"). AMUX 622 ("H" is "0") passes voltage on signal 667. AMUX 623 ("I" is "1") passes NBIAS 651.

TABLE

Mode 6

Signal values

| Mode | A | B | C | D | E | F | G | H | I |
|---|---|---|---|---|---|---|---|---|---|
| 6 | 1 | 1 | 0 | 0 | 1 | 0 | 1 | 1 | 1 |

In mode 6, N13 is on ("A" is "1"). N18 is on ("B" is "1"). N14 is off ("C" is "0"). N12 is off ("D" is "0"). N10 is on ("D" inverse is "1"). Pass gate 770 is on ("C" is "0" and "C" inverse is "1") so there is no source degeneration. N16 current mirrors P11 current to signal 667. N15 current mirrors P12 current and passes a current mirror voltage to N11 through N10. AMUX 723 ("E" is "1") passes N11 current to P10. P10 current mirrors N11 current and passes a current mirror voltage to 666 through AMUX 722 ("E" is "1"). AMUX 620 ("F" is "0") passes signal 666. AMUX 621 ("G" is "1") passes PBIAS 650. AMUX 622 ("H" is "1") and AMUX 623 ("I" is "1") pass NBIAS 651.

TABLE

Mode 7

Signal values

| Mode | A | B | C | D | E | F | G | H | I |
|---|---|---|---|---|---|---|---|---|---|
| 7 | 1 | 0 | 1 | 0 | 1 | 0 | 0 | 1 | 1 |

In Mode 7, N13 is on ("A" is "1"). N18 is off ("B" is "0"). N14 is on ("C" is "1"). N12 is off ("D" is "0"). N10 is on ("D" inverse is "1"). N16 mirrors P11 current and provides a P10 current mirror voltage to signal 667. N14 passes the P11 current mirror voltage to N15 via N14. N14 couples signal 745 (the gate of N16) to signal 752 (the gate of N15). Voltage on signal 746 depends on currents in P12 and N15. N10 is on (D inverse is "1") and passes signal 746 to signal

748. N11 produces a current dependent on voltage on signal 748. AMUX 723 ("E" is "1") passes that current to P10. AMUX 722 ("E" is "1") passes P10 current mirror voltage to signal 666. AMUX 620 ("F" is "0") and AMUX 621 ("G" is "0") pass the voltage on signal 666. AMUX 622 ("H" is "1") and AMUX 623 ("I" is "1") pass NBIAS 651. Pass gate 770 is off ("C" is "1") so source degeneration is active.

TABLE

Mode 8

| Mode | Signal values | | | | | | | | |
|---|---|---|---|---|---|---|---|---|---|
|  | A | B | C | D | E | F | G | H | I |
| 8 | 1 | 1 | 0 | 0 | 1 | 0 | 1 | 0 | 1 |

In mode 8, N13 is on ("A" is "1"). N18 is on "B" is "1"). N14 is off ("C" is "0"). N12 is off ("D" is "0"). N10 is on ("D" inverse is "1"). Pass gate 770 is on ("C" is "0" and "C" inverse is "1") so there is no source degeneration. N16 passes current from P11 and provides a current mirror voltage to signal 667. AMUX 622 ("F" is "0") passes the voltage on signal 667. AMUX 623 ("I" is "1") passes NBIAS 651. N15 carries current from P12 and produces a current mirror voltage on signal 746 and N10 passes that current mirror voltage to N11. N11 accordingly produces a current on signal 749. AMUX 723 ("E" is "1") then carries current on signal 749 to P10, and the P10 current mirror voltage is passed through AMUX 722 ("E" is "1") to signal 666. AMUX 620 ("F" is "0") passes the voltage of signal 666. AMUX 621 ("G" is "1") passes PBIAS 650. AMUX 622 ("H" is "0") passes the voltage on 667. AMUX 623 ("I" is "1") passes NBIAS 651.

TABLE

Mode 9

| Mode | Signal values | | | | | | | | |
|---|---|---|---|---|---|---|---|---|---|
|  | A | B | C | D | E | F | G | H | I |
| 9 | 1 | 1 | 0 | 0 | 1 | 0 | 0 | 0 | 0 |

In mode 9, N13 is on ("A" is "1"). N18 is on ("B" is "1"). N14 is off ("C" is "0"). N12 is off ("D" is "0"). N10 is on ("D" inverse is "1"). Pass gate 770 is on ("C" is "0") so there is no source degeneration. N16 passes P11 current and produces a current mirror voltage accordingly on signal 667. N15 passes P12 current and creates a current mode voltage on signal 746 which is forwarded through N10 to N11. N11 uses that current mirror voltage to produce a current on signal 749 that passes through AMUX 723 ("E" is "1") and P10. P10 accordingly produces a current mirror voltage on signal 743 that is passed on to signal 666 by AMUX 722 ("E" is "1"). AMUX 620 ("F" is "0") and AMUX 621 ("G" is "0") pass the current mirror voltage on 666. AMUX 622 ("H" is "0") and AMUX 623 ("I" is "0") pass voltage on 666.

Mode 10 uses the same signal values as modes 4, 6, 7, 8, and 9 except that "E" is "0" causing current from N11 to pass through R8 by AMUX 723 ("E" is "0") instead of P10, causing an I*R (current from N11 times resistance R8) drop from Vdd to signal 742. Voltage on signal 742 is selected in AMUX 722 ("E" is "0") to pass to signal 666. R8 is designed to have an I*R drop to be the same as a normal P10 current mirror voltage when passing current from N11.

FIG. 5 is a chart that shows, for each mode for the embodiment of FIGS. 6 and 7, what logic level values controller 301 must provide on control signals "A", "B", "C", "D", "E", "F", "G", "H", and "I". FIG. 5 includes a brief description of each mode. Mode 301 may store this information in an encoded form in which case the encode for each mode would need a decode to provide the logic level values needed for each mode. Alternatively, mode 301 may simply store the logic level values needed for each mode.

Those skilled in the art will understand that the exemplary drawings and description could be "turned upside down", with PFETs used where NFETs are shown, and NFETs used where PFETs are shown with connections suitably changed such that increment signals will increase differential voltage to the VCO and decrement signals will decrease differential voltage to the VCO.

Figure 8:
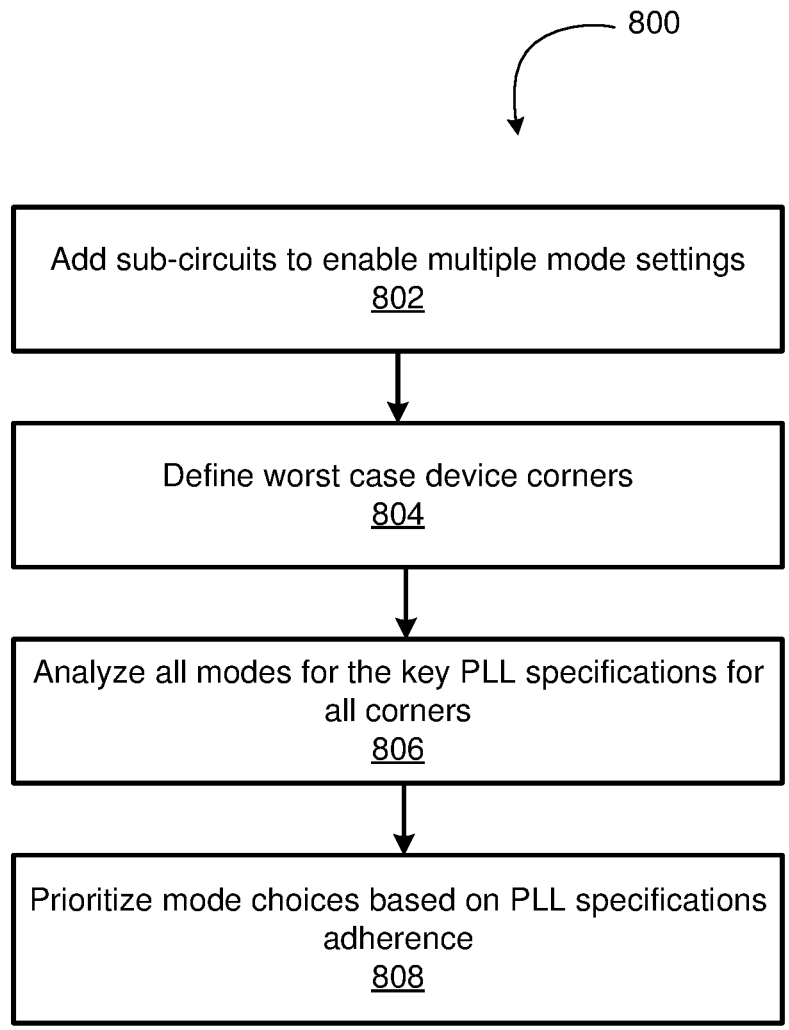
FIG. 8 is a flow chart of a method to define modes, analyze modes, and prioritize selection of modes for a given semiconductor chip.

Turning now to method embodiments of the invention, FIG. 8 shows a high level method 800 used to mitigate effects on a PLL 100 of unexpectedly large mistracking of electrical characteristics of FETs. Selection of a mode from a plurality of modes based on yield and PLL 100 stability are shown in method steps below.

In step 802, sub-circuits are created to enable a plurality of selectable modes to control currents as explained with reference to FIGS. 6 and 7. Modes available to choose from are shown in FIG. 5. Nine unique modes are defined, with a tenth mode covering a variant usable in five of the nine modes as explained earlier. The five modes are those were one or both of AMUX 620 and AMUX 621 select signal 666 to pass. The variant uses an "I*R voltage drop" instead of a PFET current mirror voltage. Current from N11 is routed through R8 by AMUX 723 ("E" is "0"). The "I*R voltage drop" is selected ("E" is "0") by AMUX 722 ("E" is "0") for signal 666.

Figure 9:
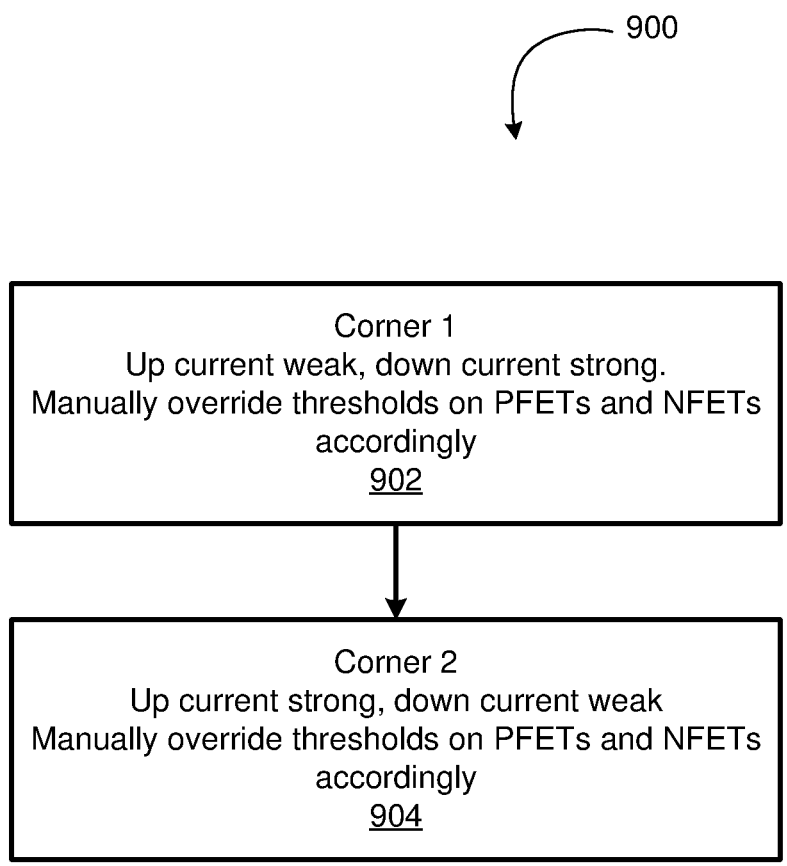
FIG. 9 is a flow chart showing two conditions where FET characteristics outside of specified process distributions are defined.

In step 804, defining worst case corners is performed. This includes the detailed nanoprobe analysis mentioned earlier to determine what measured mistracking can occur in hardware. Worst case corners also include temperature and voltage that chip 150 must operate in. For example, FIG. 9 shows a method 900 for defining corners for general PFET to NFET mistracking. In block 902, based on laboratory measurements, up currents (PFETs) are weak and down currents (NFETS) are strong. Manual overrides to device parameters, such as threshold voltages, are adjusted accordingly in simulations. In block 904, based on laboratory measurements, up current is strong and down current is weak. Again, device parameters in simulations are adjusted accordingly.

In step 806, analyzing all modes for the key PLL specifications for all corners (process, temperature, voltage) is performed. This includes doing circuit simulation on a computer to add (or subtract) FET characteristic values to selected FETs. For example, if a specified tracking of threshold voltage between a first PFET and a second PFET is plus or minus 10% but nanoprobing has discovered that PFET threshold voltages can be 25% different in different charge pump 102 slices, the circuit simulation models of PFET thresholds can be manually overridden to cover the range of actual laboratory measurements. A circuit simulation model of PLL 100 is then simulated over a specified temperature, voltage, and process corners, using the manually supplied overrides. It is understood that FET characteristics other than PFET threshold voltages may be manually overridden. In particular, NFET characteristics may also be manually overridden.

In step 808, prioritization of modes used in testing is done.

FIG. 10 shows a table of yield for each of the nine modes. 1000 case Monte Carlo circuit simulations were done. A "fail" in PLL 100 is defined as cases where the common mode voltage (Vcm 670) of the charge pump collapsed. Fails are caused by device mismatch being unusually bad inside the charge pump 100. The yield is the number of cases out of 1000 where the Vcm 670 is outside of a specified range versus WW2. In the Monte Carlo 1000 case statistical simulation, a 100 mV (millivolt) or greater difference between Vdd/2 and Vcm 670 was considered to be a "fail".

The column titled "No adders Vt as specified" shows that all modes had 100% yield. In the Monte Carlo 1000 case DC (not transient) statistical simulation used the foundry-specified circuit element distributions (e.g., a distribution of threshold voltages, a distribution of channel lengths, and so on). All modes had 100% satisfactory yield. This was expected as the design of prototype hardware, using the specified device distributions, provided for no fails to be expected.

In columns "Weak Up, Strong Down" and "Weak Down, Strong Up" PFET and NFET threshold distributions are widened by adding plus and minus ΔPVt to the specified PFET threshold distribution and plus and minus ΔNVt to the specified NFET threshold distribution. The "deltas" are based on laboratory measurements. For examples only, and not necessarily representative of actual laboratory measurements, ΔPVt may be 20 mV and ΔNVt may be 10 mV. Again, a 1000 case Monte Carlo statistical analysis was performed. Modes 3, 4, 6, 7, 8, and 9 resulted in 100%, or nearly 100% yields. Modes 1, 2, and 5 resulted in poor yields.

Besides the Monte Carlo statistical DC circuit simulations, additional analysis was done to prioritize modes to pick a mode to store in Mode 304. Method step 808 uses transient circuit simulation to further determine which modes to prioritize while deciding on a mode to use for a particular chip 150. Key PLL specifications that need to be satisfied in method step 808 are explained below. Columns under the beading "Phase Margin" are different ways of analyzing the common mode feedback loop for stability under various conditions. For example, while PLL 100 is in a locked state (i.e., reference REF 121 and feedback signal 127 are frequency and phase aligned), the charge pump loop must be stable. However, PLL 100 must also be stable when PLL 100 is in the process of locking (i.e. when PLL 100 is incrementing or decrementing).

Locked-state PSTB: PSTB is a transient and period stability circuit simulation for phase margin of PLL 100 when PLL 100 is locked.

INC, DEC=01 and INC, DEC=10: While PLL 100 is locking, INC 122 or DEC 123 can be on for a long time, such as 10 microseconds or more. Common mode voltage Vcm 670 must be stable while this is happening.

Common Mode Step: During transient simulation, a "stepped voltage" is applied to the common mode reference voltage (Vdd/2 in the examples shown and described). A designer reviews the transient simulation of PLL 100 simulation to make sure no oscillation occurs.

FMIN to Lock: This transient simulation turns on DEC 123 (or INC 122) by asserting RESET 128 to set PLL 100 frequency to minimum (or maximum), then releases a reset on PLL 100 to let it lock, as explained earlier.

FIG. 11 shows a table that summarizes phase margin results of transient simulations for each of the nine modes. Large phase margins are desirable. Mode 7 showed instability in several simulations. Mode 9 shows marginal stability.

Prioritizing mode selection candidates for selecting a mode for each particular chip is desirable to save time at the tester (or during bring up in some embodiments of the invention). The simulations shown in FIGS. 10 and 11 suggest that mode 8 may be the most likely candidate and should be tried first as it has almost 100% yield and good phase margin. After mode 8, mode 4 has good phase margin but slightly less yield. Mode 3 may be a mode to try next as yield is good, but phase margin is only 22.7 degrees. If modes 8, 4, and 3 do not give satisfactory results, other modes may be tried by the tester. Further experience during product testing and process maturity may change prioritization order.

What is claimed is:

1. A phase locked loop (PLL) comprising:
   a charge pump having a plurality of selectable modes from which to select a mode to mitigate effects of more than a specified mismatching of Field Effect Transistors (FETs) using circuitry controlled by the selected mode;
   a phase frequency detector (PFD) to compare a reference signal having a reference signal frequency with a feedback signal frequency;
   the charge pump coupled to an increment signal and a decrement signal from the PFD, the charge pump outputs a differential signal, the differential signal having a differential voltage between a plus phase and a minus phase of the differential signal, circuitry in the charge pump increases the differential voltage when the increment signal is active and decreases the differential voltage when the decrement signal is active;
   a voltage controlled oscillator (VCO) coupled to the differential signal driven by the charge pump, the VCO outputs a frequency dependent on the differential voltage; and
   a 1/N divider that divides the frequency of the frequency output by the VCO by "N", where "N" is the ratio of the VCO output frequency to the feedback reference signal frequency, the 1/N divider outputs the feedback signal frequency;
   the charge pump further comprising:
   a current router, further comprising a first current routing tree and a second current routing tree, that receives the increment signal and the decrement signal, when the increment signal is active, the circuitry increases the differential voltage, when the decrement signal is active the circuitry decreases the differential voltage;
   a first controllable current source to supply current to the current router from a first supply voltage;
   a second controllable current source to supply current from the current router to a second supply voltage lower than the first supply voltage; and
   a controller to control the first and the second controllable current sources based on the selected mode, the selected mode for a particular semiconductor chip being stored on the particular semiconductor chip;
   wherein the first controllable current source may be controlled to adjust current of FETs of a first type selected from types consisting of a PFET and an NFET are delivering an unexpected amount of current, the second controllable current source may be controlled to adjust current of a second type of FETs, the second type opposite the first type, are delivering an unexpected amount of current, both the first current source and the second current source may be controlled to adjust current from both types of FETs when both FET types are delivering unexpected amounts of current, "unexpected amounts of current" resulting from the more than a specified mismatching of Field Effect Transistors; and the charge pump further comprising:
an amplifier to compare a common mode voltage (Vcm) against a reference voltage and output a first amplifier voltage that may be used to control the first controllable current source, and to control a second amplifier voltage that may be used to control the second controllable current source;
the plus phase of the differential signal is driven by a first branch of the second tree and the minus phase of the differential signal is driven by a second branch of the first tree;
the Vcm is the common mode voltage between voltages on a second branch of the second tree and a first branch of the first tree.

2. The PLL of claim 1, the amplifier comprising an FET differential amplifier comprising:
an FET differential pair comprising a first FET and a second FET, and a selectable source degeneration resistor coupled between sources on the FET differential pair, the first FET and the second FET being of the first type of FET;
tail currents for the first and second FETs of the FET differential pair sources supply currents from the first voltage supply;
a third FET of the second type having a drain coupled to a drain of the first FET and a source coupled to the second voltage supply, and a fourth FET of the second type having a drain coupled to a drain of the second FET and a source coupled to the second voltage supply;
a fifth FET of the second type coupled between the drain of the third FET and a gate of the third FET, a gate of the fifth FET coupled to a first control signal from the selected mode, and a sixth FET of the second type coupled between the drain of the fourth FET and a gate of the fourth FET, a gate of the fifth FET coupled to a second control voltage from the selected mode;
a seventh FET of the second type coupled between the gate of the third FET and the gate of the fourth FET, a gate of the seventh FET coupled to a third control voltage from the selected mode;
an eighth FET of the second type having a source coupled to the second supply voltage, a gate coupled to a fourth control voltage from the selected mode, and a drain coupled to a gate of a tenth FET of the second type, a ninth FET of the second type coupled between the drain of the fourth FET and the drain of the eighth FET, a gate of the ninth FET coupled to an inverted fourth control voltage from the selected mode;

the tenth FET having a drain coupled to the first amplifier voltage and a source coupled to the second voltage supply; and
the third FET having a drain coupled to the second amplifier voltage.

3. The PLL of claim 2, the amplifier further comprising a first analog multiplexer to select a voltage mirror in the amplifier to control the tail currents, or
a voltage from outside the amplifier to control the tail currents.

4. The PLL of claim 2, the amplifier further comprising:
a second analog multiplexer to select, based on a fifth control voltage from the selected mode, to run current from the tenth FET through a resistor having a distal end coupled to the first supply voltage or to an eleventh FET of the first type, a drain and a gate of the eleventh FET coupled together, and a third analog multiplexer, controlled by the fifth control voltage from the selected mode, passing voltage on a proximal end of the resistor or a drain voltage of the tenth FET to the first output of the amplifier.

5. The PLL of claim 1, further comprising:
a fourth analog multiplexer to select as a fourth analog multiplexer output, based on a sixth control value from the selected mode, a current mirror voltage from the twelfth FET of the first type, and the first amplifier voltage; and
a fifth analog multiplexer to select, as a fifth analog multiplexer output, based on a seventh control value from the selected mode, the current mirror voltage from the twelfth FET and the first amplifier voltage.

6. The PLL of claim 5, the fourth analog multiplexer output and the fifth analog multiplexer output controlling a first current value from the first controllable current source to a first current routing tree and controlling a second current value, equal to the first current value, from the controllable current source to a second current routing tree.

7. The PLL of claim 6 further comprising:
a sixth analog multiplexer to select as a sixth analog multiplexer output, based on an eighth controller value from the selected mode, a current mirror voltage from a thirteenth FET of the second type and the second amplifier voltage; and
a seventh analog multiplexer to select as a seventh analog multiplexer output, based on a ninth controller value from the selected mode, the current mirror voltage from the thirteenth FET and the second amplifier voltage.

8. The PLL of claim 1 further comprising:
a plurality of charge pump slices having the plus phase outputs of each of the charge pump slices coupled together and the minus phase outputs of each of the charge pump slices coupled together.

9. The PLL of claim 8 further comprising:
a first buffer circuit in a first charge pump slice to buffer the increment and decrement input signals and to buffer and pass copies of the increment and decrement signals to a second buffer circuit in a second charge pump slice.

* * * * *